(12) United States Patent
Meiners et al.

(10) Patent No.: US 9,920,575 B2
(45) Date of Patent: Mar. 20, 2018

(54) FORMATION-ENGAGING ELEMENT PLACEMENT ON EARTH-BORING TOOLS AND RELATED METHODS

(71) Applicant: Baker Hughes Incorporated, Houston, TX (US)

(72) Inventors: Matthew J. Meiners, Conroe, TX (US); Scott F. Donald, Spring, TX (US); Reed W. Spencer, Spring, TX (US)

(73) Assignee: Baker Hughes Incorporated, Houston, TX (US)

( * ) Notice: Subject to any disclaimer, the term of this patent is extended or adjusted under 35 U.S.C. 154(b) by 975 days.

(21) Appl. No.: 14/263,615

(22) Filed: Apr. 28, 2014

(65) Prior Publication Data

US 2014/0332285 A1 Nov. 13, 2014

Related U.S. Application Data

(60) Provisional application No. 61/820,425, filed on May 7, 2013.

(51) Int. Cl.
*E21B 10/43* (2006.01)
*E21B 10/55* (2006.01)
*G06F 17/50* (2006.01)

(52) U.S. Cl.
CPC .............. *E21B 10/43* (2013.01); *E21B 10/55* (2013.01); *G06F 17/50* (2013.01); *G06F 17/5009* (2013.01)

(58) Field of Classification Search
CPC ........ E21B 10/567; E21B 10/55; E21B 10/56; E21B 10/00; E21B 10/43; G06F 7/48; G06F 7/60

USPC ........................................ 703/3, 10; 175/431
See application file for complete search history.

(56) References Cited

U.S. PATENT DOCUMENTS

| | | | |
|---|---|---|---|
| 6,349,780 | B1 | 2/2002 | Beuershausen |
| 6,785,641 | B1 | 8/2004 | Huang |
| 7,693,695 | B2 | 4/2010 | Huang et al. |
| 7,827,014 | B2 | 11/2010 | Chen |
| 7,860,693 | B2 | 12/2010 | Chen |

(Continued)

OTHER PUBLICATIONS

International Preliminary Report on Patentability for PCT Application No. PCT/US2014/037046 dated Nov. 10, 2015, 8 pages.

(Continued)

*Primary Examiner* — Michael R Wills, III
(74) *Attorney, Agent, or Firm* — TraskBritt

(57) ABSTRACT

Earth-boring tools include a cutting element positioned on a drill bit body at a radial distance from a longitudinal axis thereof. At least two formation-engaging elements are positioned at the same radial distance from the longitudinal axis as the cutting element. The formation-engaging elements are recessed from a cutting profile of the cutting element by a distance within about 10% of d, wherein $d=(\alpha*x)/(1800*y)$, where $\alpha$ is an angle between the formation-engaging element and the cutting element, x is a rate of penetration of the drill bit body, and y is a rotation speed of the drill bit body. Additional earth-boring tools include at least one cutting element and at least two formation-engaging elements recessed from a cutting profile of the at least one cutting element at a common angle. Methods relate to forming such earth-boring tools.

20 Claims, 2 Drawing Sheets

(56) References Cited

U.S. PATENT DOCUMENTS

| | | | |
|---|---|---|---|
| 8,100,202 B2* | 1/2012 | Durairajan | E21B 10/43 175/426 |
| 8,584,776 B2 | 11/2013 | Radford et al. | |
| 2003/0034181 A1 | 2/2003 | Swadi | |
| 2007/0192074 A1 | 8/2007 | Chen | |
| 2012/0024609 A1 | 2/2012 | Dykstra et al. | |
| 2012/0152623 A1 | 6/2012 | Chen | |
| 2013/0054203 A1 | 2/2013 | Herbig et al. | |
| 2013/0228378 A1* | 9/2013 | Chen | E21B 10/43 175/57 |
| 2015/0247398 A1* | 9/2015 | Pelletier | G01P 15/097 175/41 |
| 2015/0322781 A1* | 11/2015 | Pelletier | E21B 3/00 175/41 |

OTHER PUBLICATIONS

International Search Report for PCT Application No. PCT/US2014/037046 dated Sep. 30, 2014; 4 pages.
Written Opinion of the International Searching Authority for PCT Application No. PCT/US2014/037046 dated Sep. 30, 2014, 7 pages.

* cited by examiner

FORMATION-ENGAGING ELEMENT PLACEMENT ON EARTH-BORING TOOLS AND RELATED METHODS

CROSS-REFERENCE TO RELATED APPLICATION

This application claims the benefit of the filing date of the U.S. Provisional Patent Application No. 61/820,425, filed May 7, 2013, the disclosure of which is hereby incorporated herein in its entirety by this reference.

TECHNICAL FIELD

Embodiments of the present disclosure generally relate to earth-boring tools that include one or more formation-engaging elements, such as secondary cutters and/or depth of cut control features, as well as methods of positioning such formation-engaging elements on bodies of earth-boring tools.

BACKGROUND

Earth-boring tools are commonly used for forming (e.g., drilling and reaming) boreholes or wells (hereinafter "wellbores") in earth formations. Earth-boring tools include, for example, rotary drill bits, core bits, eccentric bits, bicenter bits, reamers, underreamers, and mills.

Different types of earth-boring rotary drill bits are known in the art including, for example, fixed-cutter bits (which are often referred to in the art as "drag" bits), rolling-cutter bits (which are often referred to in the art as "rock" bits), diamond-impregnated bits, and hybrid bits (which may include, for example, both fixed cutters and rolling cutters). The drill bit is rotated and advanced into the subterranean formation. As the drill bit rotates, the cutters or abrasive structures thereof cut, crush, shear, and/or abrade away the formation material to form the wellbore.

The drill bit is coupled, either directly or indirectly, to an end of what is referred to in the art as a "drill string," which comprises a series of elongated tubular segments connected end-to-end that extends into the wellbore from the surface of the formation. Often various tools and components, including the drill bit, may be coupled together at the distal end of the drill string at the bottom of the wellbore being drilled. This assembly of tools and components is referred to in the art as a "bottom hole assembly" (BHA).

The drill bit may be rotated within the wellbore by rotating the drill string from the surface of the formation, or the drill bit may be rotated by coupling the drill bit to a downhole motor, which is also coupled to the drill string and disposed proximate the bottom of the wellbore. The downhole motor may comprise, for example, a hydraulic Moineau-type motor having a shaft, to which the drill bit is attached, that may be caused to rotate by pumping fluid (e.g., drilling mud or fluid) from the surface of the formation down through the center of the drill string, through the hydraulic motor, out from nozzles in the drill bit, and back up to the surface of the formation through the annular space between the outer surface of the drill string and the exposed surface of the formation within the wellbore.

Fixed-cutter drill bits typically include a plurality of cutting elements that are attached to a face of bit body. The bit body may include a plurality of wings or blades, which define fluid courses between the blades. The cutting elements may be secured to the bit body within pockets formed in outer surfaces of the blades. The cutting elements are attached to the bit body in a fixed manner, such that the cutting elements do not move relative to the bit body during drilling. The bit body may be formed from steel or a particle-matrix composite material (e.g., cobalt-cemented tungsten carbide). In embodiments in which the bit body comprises a particle-matrix composite material, the bit body may be attached to a metal alloy (e.g., steel) shank having a threaded end that may be used to attach the bit body and the shank to a drill string. As the fixed-cutter drill bit is rotated within a wellbore, the cutting elements scrape across the surface of the formation and shear away the underlying formation.

BRIEF SUMMARY

In some embodiments, earth-boring tools include a drill bit body having a longitudinal axis, a cutting element positioned on the drill bit body at a radial distance from the longitudinal axis, and at least two formation-engaging elements positioned on the drill bit body at the same radial distance from the longitudinal axis as the cutting element. The cutting element defines a cutting profile when the drill bit body is rotated through one full revolution without advancing the drill bit body along the longitudinal axis, and exhibits a first cutting aggressivity. The formation-engaging elements each exhibit a second, lower cutting aggressivity than the first cutting aggressivity. The formation-engaging elements are each recessed from the cutting profile of the cutting element by a distance within about 10% of d, wherein $d=(\alpha*x)/(1800*y)$, where d is in inches, $\alpha$ is an angle in degrees between respective formation-engaging elements of the at least two formation-engaging elements and the cutting element about the longitudinal axis, x is a rate of penetration of the drill bit in feet per hour, y is a rotation speed of the drill bit in revolutions per minute, and the numeral 1800 is in dimensions of (degrees*feet*minutes) divided by (revolutions*inches*hours).

In some embodiments, earth-boring tools include a drill bit body having a longitudinal axis, at least one cutting element positioned on the drill bit body at a radial distance from the longitudinal axis, and at least two formation-engaging elements positioned on the drill bit body at the same radial distance from the longitudinal axis as a respective cutting element of the at least one cutting element. The at least one cutting element defines a cutting profile when the drill bit body is rotated through one full revolution without advancing the drill bit body along the longitudinal axis, and exhibits a first cutting aggressivity. The at least two formation-engaging elements exhibit a second, lower cutting aggressivity than the first cutting aggressivity. Each of the at least two formation-engaging elements is recessed from the cutting profile of the respective cutting element at a common angle from the cutting profile of the respective cutting element.

In some embodiments, methods of forming an earth-boring tool include creating a model of an earth-boring tool with a computer and forming the earth-boring tool based on the model. Creating a model includes selecting a location on an earth-boring tool to be formed to position a formation-engaging element, determining a radial distance of the location from a longitudinal axis of the earth-boring tool to be formed, identifying a cutting element at a substantially similar radial distance as the location, and determining an angle $\alpha$ about the longitudinal axis between the cutting element and the location. Forming the earth-boring tool includes positioning a formation-engaging element on the earth-boring tool at the location such that the formation-engaging element is recessed from a cutting profile of the cutting element by a distance within about 10% of d, wherein d=(α*x)/(1800*y), where d is in inches, α is in degrees, x is a target rate of penetration of the earth-boring tool in feet per hour, y is a target rotation speed of the earth-boring tool in revolutions per minute, and the numeral 1800 is in dimensions of (degrees*feet*minutes)/(revolutions*inches*hours).

DETAILED DESCRIPTION

The illustrations presented herein are not meant to be actual views of any particular cutting element, earth-boring tool, or portion of a cutting element or tool, but are merely idealized representations which are employed to describe embodiments of the present disclosure. Additionally, elements common between figures may retain the same numerical designation.

As used herein, the term "substantially" in reference to a given parameter, property, or condition means and includes to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, or even at least 99% met.

As used herein, the term "earth-boring tool" means and includes any tool used to remove formation material and form a bore (e.g., a wellbore) through a formation by way of the removal of the formation material. Earth-boring tools include, for example, rotary drill bits (e.g., fixed-cutter or "drag" bits and roller cone or "rock" bits), hybrid bits including both fixed cutters and roller elements, coring bits, percussion bits, bi-center bits, reamers (including expandable reamers and fixed-wing reamers), and other so-called "hole-opening" tools.

As used herein, any relational term, such as "first," "second," "third," "on," etc., is used for clarity and convenience in understanding the disclosure and accompanying drawings and does not connote or depend on any specific preference, orientation, or order, except where the context clearly indicates otherwise.

Embodiments of the present disclosure include earth-boring tools and drill bits thereof that include one or more formation-engaging elements in addition to cutting elements, and methods of predetermining a position of at least one formation-engaging element. The formation-engaging elements are positioned at substantially a same radial distance as at least one cutting element and at an angle around the drill bit from the associated cutting element. Each of the formation-engaging elements may be recessed from a cutting profile of the associated cutting element a distance that is a function of the angle around the drill bit. The position of each of the formation-engaging elements on the drill bit may be predetermined by performing a simulation to determine likely locations of contact between a body of the drill bit (e.g., a portion of a bit blade) and a formation to be drilled by the drill bit. Such earth-boring tools, drill bits, and methods may improve performance of the tools and drill bits, such as drill bits employed with a so-called "adjustable kick off" (AKO) sub for directional drilling.

Figure 1:
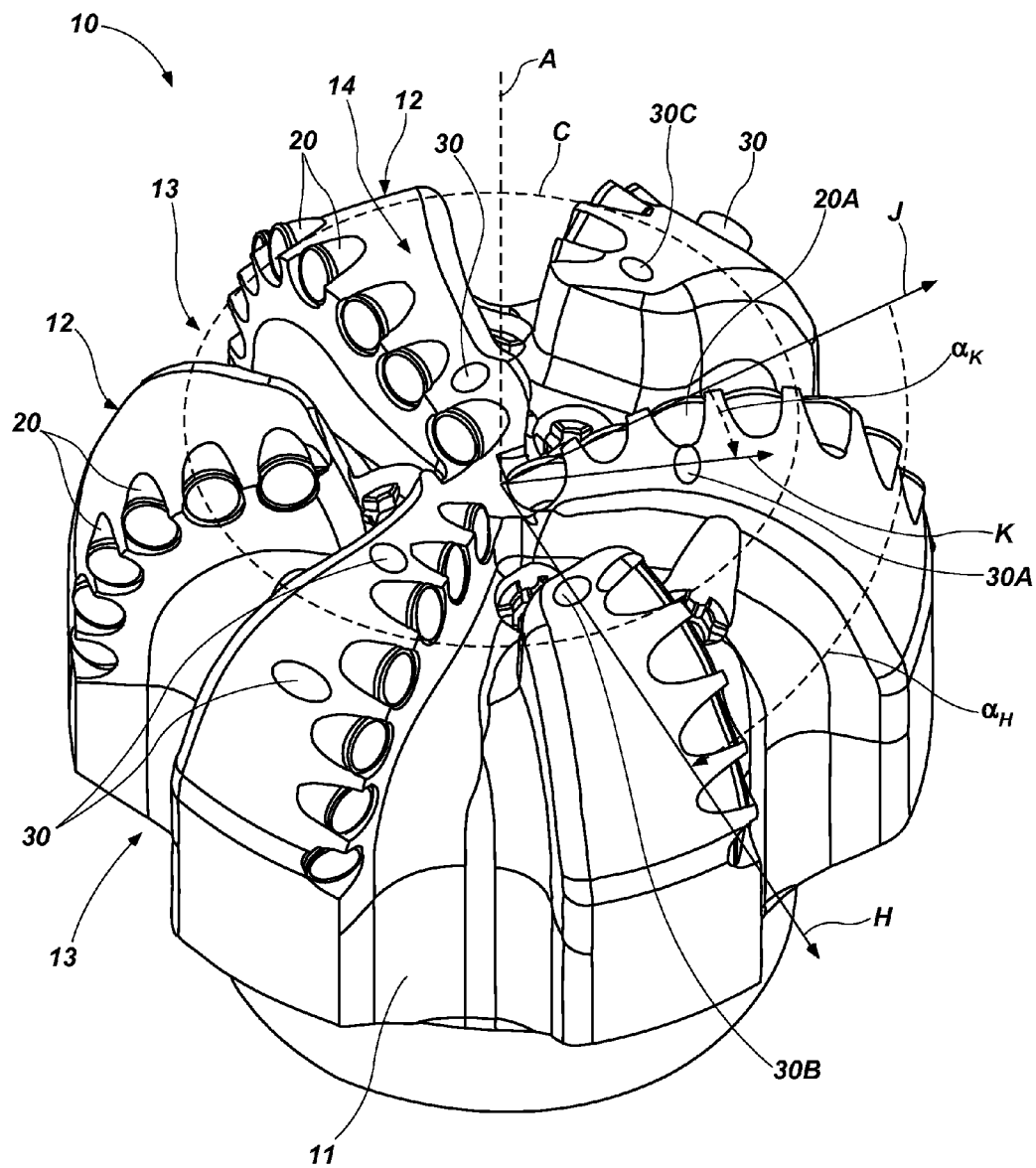
FIG. 1 is a perspective view of an earth-boring tool according to embodiments of the present disclosure.

Referring to FIG. 1, a drill bit 10 of an earth-boring tool includes a bit body 11, a plurality of blades 12 separated by fluid courses 13, and a plurality of cutting elements 20 (e.g., primary cutting elements) positioned on the blades 12. The drill bit 10 may include a longitudinal axis A about which the drill bit 10 may rotate during a drilling operation. In some embodiments, the drill bit 10 may rotate directly about the axis A (i.e., substantially maintaining the axis A at a center of rotation of the drill bit 10) during operation, while in other embodiments, the drill bit 10 may rotate eccentrically about the axis A. For example, eccentric rotation may result from the drill bit 10 being coupled to and used with an AKO sub, such as for directional drilling. The AKO sub may be positioned in a bottom hole assembly (BHA) proximate the drill bit 10 to angle the drill bit 10 relative to a longitudinal axis of a hole formed in a formation by the drill bit 10. By way of example and not limitation, the drill bit 10 may be angled relative to the longitudinal axis of the hole by up to about 2.5°, such as between about 0.15° and about 2°. In some embodiments, the AKO may be used to angle the drill bit 10 between about 0.35° and about 1°.

A cone region 14 of the drill bit may be generally radially inside a circle C illustrated in FIG. 1. The cone region 14 may be defined by a portion of the drill bit 10 and blades 12 thereof that roughly extends along a shape of an inverted cone from approximately the circle C to approximately the axis A.

The drill bit 10 may also include one or more formation-engaging elements 30 positioned on the bit body 11 at predetermined locations, such as on the blades 12. The formation-engaging elements 30 may be positioned within the cone region 14, outside of the cone region 14, or both inside and outside of the cone region 14. By way of example and not limitation, one or more of the formation-engaging elements 30 may be configured as a depth of cut control (DOCC) feature to provide vibration reduction and directional control to the drill bit 10 when in operation. Example DOCC features that may be used as one or more of the formation-engaging elements are described in U.S. patent application Ser. No. 12/696,735, filed Jan. 29, 2010, now U.S. Pat. No. 8,584,776, titled "Methods, Systems, and Tool Assemblies for Distributing Weight Between an Earth-boring Rotary Drill Bit and a Reamer Device," the entire disclosure of which is hereby incorporated by reference. By way of further example, one or more of the formation-engaging elements 30 may be configured as a cutting element, such as a secondary cutting element having a cutting aggressivity less than a cutting aggressivity of the (primary) cutting elements 20. In some embodiments, the formation-engaging elements 30 may have characteristics of both DOCC features and cutting elements. As used herein, the term "aggressivity" means a relative ability to cut into and remove a formation material. The aggressivity of a cutting element is influenced by a number of factors, such as, for example: an exposure (e.g., the extent of protrusion into the formation) of the cutting element; a presence, type, size, quantity, shape, and exposure of abrasive particles in the cutting element; a side rake angle of the cutting element; a back rake angle of the cutting element; a front rake angle of the cutting element; a shape of the cutting element; a size of the cutting element; a sharpness of a cutting edge of the cutting element.

Although the formation-engaging elements 30 are referred to herein as "formation-engaging," the formation-engaging elements 30 do not necessarily engage the formation in all circumstances. Rather, the formation-engaging elements 30 may engage a formation being drilled by the drill bit 10 during operation of the drill bit 10 when certain threshold parameters are met, such as a sufficient weight on bit (WOB), rate of penetration (ROP), revolution speed (e.g., revolutions per minute (RPM)), etc.

The formation-engaging elements 30 may be, for example, raised portions or protrusions of the blades 12 or elements formed separately from the blades 12 and affixed to the blades 12. In embodiments in which the formation-engaging elements 30 are formed separately from the blades 12, the formation-engaging elements 30 may be affixed to the blades 12, such as by welding, brazing, or otherwise attaching the formation-engaging elements 30 on an outer surface of the blades 12 or within pockets (e.g., recesses) formed in the blades 12. In some embodiments, the formation-engaging elements 30 may be removably affixed to the blades 12, such as by a threaded connection or mechanical interference. Such removable formation-engaging elements 30 may be replaced after becoming worn, to extend the usable life of the drill bit 10. The formation-engaging elements 30 may be formed of an abrasion resistant material, such as a material including one or more of a carbide material (e.g., tungsten carbide), a composite material (e.g., a material including a metal matrix with carbide, diamond, or diamond-like particles dispersed therein), a solid diamond or diamond-like material, and a hardfacing material disposed over a base substrate.

Each of the cutting elements 20 may be, for example, a so-called "polycrystalline diamond compact" (PDC) cutting element that includes a metal, carbide, or composite (e.g., metal matrix with hard particles dispersed therein) base substrate and a volume of PDC affixed to a face of the base substrate, as shown in FIG. 1. However, the present disclosure is not limited to drill bits 10 including cutting elements 20 that are PDC cutting elements of the configuration described herein by way of example. Alternatively or additionally, the present disclosure includes the use of cutting elements of any other known material(s) and configuration(s), such as cutting posts, generally conical cutting teeth, ridge-like cutting structures, etc. The cutting elements 20 may have a cutting aggressivity that is greater than a cutting aggressivity of the formation-engaging elements 30. Thus, the cutting elements 20 may be configured to remove formation material at a greater rate than the formation-engaging elements 30.

Each of the formation-engaging elements 30 may be positioned at a same or similar radial position (i.e., distance from the axis A) as at least one of the cutting elements 20. Thus, during a drilling operation, a particular formation-engaging element 30 may lie at least partially within a groove formed in the formation by the cutting of the at least one cutting element 20 that is positioned at the same radial position. The cutting element 20 and the formation-engaging element 30 that are positioned at the same radial position are also referred to herein as being associated with one another.

During a drilling operation, each of the cutting elements 20 may cut into the formation to be drilled a certain depth, referred to as the "depth of cut." The depth of cut may be a function of various parameters, such as drill bit design, cutting element geometry, total number of cutting elements 20, relative placement of the cutting elements 20, a force with which the drill bit is longitudinally pressed against the formation (e.g., so-called "weight on bit" (WOB)), formation characteristics (e.g., hardness), and placement of the formation-engaging elements 30, among other parameters. For example, the formation-engaging elements 30 may be configured and positioned to contact the formation when respectively associated cutting elements 20 reach a predetermined depth of cut. In some embodiments, the formation-engaging elements 30 may be configured to slide against the formation without cutting (or with minimal cutting) into the formation, such that the formation-engaging elements 30 provide a stop for controlling (e.g., limiting) the depth of cut of the associated cutting elements 20, along with depths of cut of other (e.g., non-associated) cutting elements 20. As explained above, in other embodiments, the formation-engaging elements 30 may be configured to at least partially cut into the formation when the formation-engaging elements 30 engage the formation.

A target depth of cut may be predetermined based on, for example, desired or expected cutting parameters. By way of example and not limitation, the target depth of cut may be related to a rate of penetration (ROP) of the drill bit 10 into the formation, revolutions per minute (RPM) of the drill bit 10, formation characteristics (e.g., hardness), expected or desired level of wear of the drill bit 10, etc. Each of the formation-engaging elements 30 may be positioned to be recessed from a cutting profile of an associated cutting element 20 at a predetermined distance such that, when the associated cutting element 20 reaches a predetermined depth of cut into the formation, the formation-engaging element 30 contacts the formation. As used herein, the phrase "cutting profile" of a cutting element 20 means a position of a surface of a formation formed by rotating the drill bit 10 one full revolution, without longitudinally advancing the drill bit 10 into the formation. Similarly, a cutting profile of the drill bit 10, as a whole, means a position of a surface of a formation formed in a similar manner, taking all cutting elements and other components of the drill bit 10 into consideration.

Referring again to FIG. 1, by way of example, a particular cutting element 20A and a first formation-engaging element 30A may be located on the drill bit 10 at a substantially similar (e.g., the same) radial distance from the longitudinal axis A of the drill bit 10. The particular cutting element 20A may be positioned along a first radial direction J from the axis A, and the first formation-engaging element 30A may be positioned along a second radial direction K from the axis A. The second radial direction K may be oriented at an angle $\alpha_K$ relative to the first radial direction J. Thus, the first formation-engaging element 30A is positioned on the drill bit 10 at the angle $\alpha_K$ from the associated cutting element 20A.

Additionally or alternatively, a second formation-engaging element 30B may located on the drill bit 10 at a substantially similar (e.g., the same) radial distance from the axis A as the particular cutting element 20A. The second formation-engaging element 30B may be positioned along a third radial direction H from the axis A. The third radial direction H may be oriented at an angle $\alpha_H$ relative to the first radial direction J. Thus, the second formation-engaging element 30B is positioned on the drill bit 10 at the angle $\alpha_H$ from the associated cutting element 20A. The angle $\alpha_H$ may be greater than the angle $\alpha_K$.

In accordance with embodiments of the present disclosure, a distance d that a formation-engaging element 30 is to be recessed from a cutting profile of a cutting element 20 located at the same radial position from the axis A may be a function of an angle α between the formation-engaging element 30 and the cutting element 20, a target rate of penetration (ROP) x of the drill bit 10, and a target rotation speedy of the drill bit 10. The distance d may relate to the angle α, the target ROP x, and the target rotation speedy according to the following equation:

$$d=(\alpha*x)/(1800*y),$$

wherein the recess distance d is expressed in inches, the angle α is expressed in degrees, the target ROP x is expressed in feet per hour, the target rotation speedy is expressed in revolutions per minute (RPM), and the numeral 1800 is a conversion factor having dimensions of (degrees*feet*minutes)/(revolutions*inches*hours). The target ROP x and the target rotation speed y may be desired or expected values (e.g., average desired or expected values) during operation of the drill bit 10. Thus, given a target ROP x and a target rotation speedy of the drill bit 10, a particular formation-engaging element 30 to be located at an angle α from an associated cutting element 20 may be positioned on the drill bit 10 recessed a distance d from a cutting profile of the associated cutting element 20 according to the above equation. By way of example and not limitation, the target ROP x may be about 150 ft/hr or more, about 125 ft/hr or more, or about 100 ft/hr or more, and the target rotation speedy may be about 180 RPM or more, about 140 RPM or more, or about 40 RPM or more.

Due to manufacturing tolerances and/or desired adjustments to the characteristics (e.g., cutting aggressivity, depth of cut, stability) of the drill bit 10, the formation-engaging element 30 may be recessed on the drill bit 10 from a cutting profile of a cutting element 20 located at the same radial position from the axis A within a range of distances from the calculated distance d. By way of example and not limitation, a particular formation-engaging element 30 may be recessed by a distance within about 10%, within about 5%, or within about 1% of the calculated distance d from the cutting profile of an associated cutting element 20.

Figure 2:
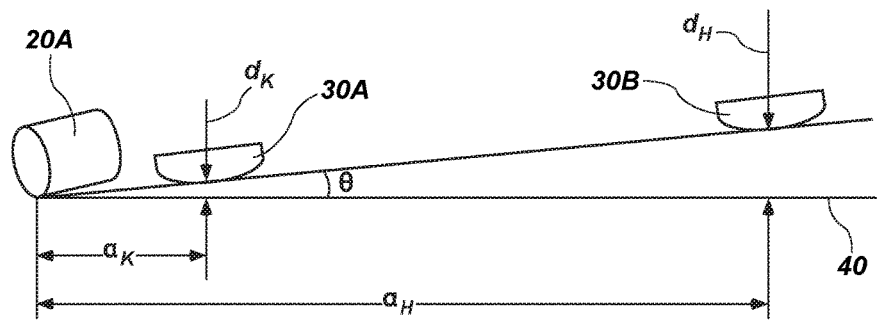
FIG. 2 is a schematic illustration used to illustrate methods of the present disclosure that may be used to locate and position formation-engaging elements on an earth-boring tool relative to a cutting element of the earth-boring tool and a cutting profile of the cutting element.

Referring to FIG. 2, for example, the first formation-engaging element 30A, which is positioned at the angle $\alpha_K$ from the associated cutting element 20A (as discussed above with reference to FIG. 1), may be positioned a distance $d_K$ from a cutting profile 40 of the cutting element 20A. The above equation may be used to determine the distance $d_K$. By way of comparison, the second formation-engaging element 30B, which is positioned at the angle $\alpha_H$ from the associated cutting element 20A (as discussed above with reference to FIG. 1), may be positioned a distance $d_H$ from the cutting profile 40. The above equation may be used to determine the distance $d_H$, which may be greater than the distance $d_K$ due to the value of the angle $\alpha_H$ being greater than the angle $\alpha_K$.

As shown in FIG. 2, the first and second formation-engaging elements 30A and 30B may be positioned along a common line that extends at an angle θ from the cutting profile 40 of the associated cutting element 20A. The angle θ between the cutting profile 40 of any of the cutting elements 20 and a respective formation-engaging element 30 may depend on the target ROP and target rotation speed of the drill bit 10. Since the target ROP and target rotation of speed is constant for a given drill bit design, the angle θ may be common to more than one of the formation-engaging elements 30, regardless of whether the formation-engaging elements 30 share a common associated cutting element 20. Thus, each formation-engaging element 30 of a plurality of formation-engaging elements 30 of the drill bit 10 may be positioned at a common angle θ from a cutting profile 40 of a respective associated cutting element 20.

Although the line representing the cutting profile 40 and the line along which the formation-engaging elements 30A and 30B are positioned appear as lying within a common plane (e.g., the plane of the paper) in the schematic of FIG. 2, it is to be understood that the cutting profile 40 and the line along which the formation-engaging elements 30A and 30B are positioned may, in reality, be curved about the longitudinal axis A (FIG. 1). Thus, if the line representing the cutting profile 40 were to be extended in real space about the axis A, the line would be circular. Similarly, if the line along which the formation-engaging elements 30A and 30B are positioned were to be extended in real space about the axis A, the line would be helical.

The above equation may result in determining a distance d for placement of a formation-engaging element 30 along or relative to a helical path formed by an associated cutting element 20 as the drill bit 10 is rotated and advanced into a formation. Thus, embodiments of the present disclosure may be employed to determine improved placement of the formation-engaging elements 30.

Referring again to FIG. 1, in some embodiments, a third formation-engaging element 30C may additionally or alternatively be positioned on the drill bit 10 at a substantially similar (e.g., the same) radial distance from the axis A as the particular cutting element 20A. The third formation engaging element 30C may be positioned to trail the particular cutting element 20A by more than 180°. Thus, the third formation-engaging element 30C may appear to be "leading" the particular cutting element 20A due to its placement on a portion of the bit body 11 (e.g., a blade 12) that rotationally leads the particular cutting element 20A (i.e., is rotationally in front of and within 180° of a cutting face of the particular cutting element 20A). However, the third formation-engaging element 30C may be recessed at a distance from the cutting profile 40 of the associated cutting element 20A according to an angle that it trails the associated cutting element 20A, using the methods described above with reference to FIG. 2. Since the third formation-engaging element 30C is positioned at an angle greater than the angles $\alpha_K$ and $\alpha_H$, the calculated recess distance of the third formation-engaging element 30C may be greater than the calculated recess distances $d_K$ and $d_H$.

The angle α of a particular formation-engaging element 30 may be determined by determining a location on the drill bit 10 for positioning the formation-engaging element 30, determining a cutting element 20 that is positioned at a substantially similar (e.g., the same) radial position from the axis A, and measuring or calculating the angle α that the formation-engaging element 30 trails the cutting element 20. The determination of the location on the drill bit 10 where the formation-engaging element 30 to be positioned may be arbitrary, based on trial-and-error, based on experience of a manufacturer of a drill bit, or may be based on a determination of expected rubbing of the bit body 11 (e.g., a surface of the blades 12) against the formation in the absence of the formation-engaging element 30. Expected rubbing of the bit body 11 against the formation may be calculated using methods described below with reference to FIG. 3, for example.

Figure 3:
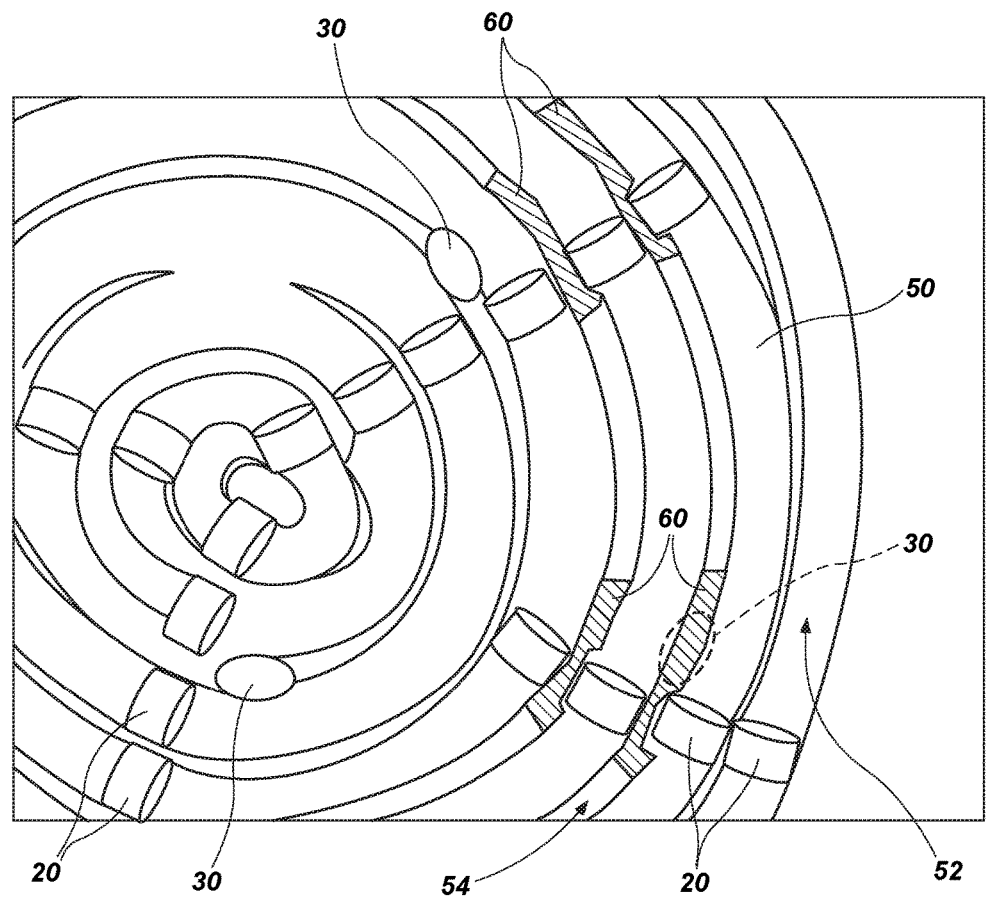
FIG. 3 is a schematic illustration showing a representation of cutting elements and formation-engaging elements contacting a formation that may be used to determine placement of formation-engaging elements according to embodiments of the present disclosure.

FIG. 3 illustrates a schematic that includes representations of the cutting elements 20, formation-engaging elements 30, and the formation 50 to be drilled. A plurality of grooves 52 and ridges 54 may be formed in a formation 50 by operation of the cutting elements 20 and/or the formation-engaging elements 30 rotating under WOB within the formation 50. Rubbing areas 60 may illustrate locations where a portion of the bit body 11 (FIG. 1) (e.g., a surface of a blade 12) rubs against the formation 50 during a drilling operation.

A schematic similar to FIG. 3 may be produced using a computer. For example, a computer may include a processor programmed to accept inputs from a user regarding drilling parameters and drill bit design. By way of example and not limitation, user inputs may include one or more of formation characteristics (e.g., hardness), drill bit rotation speed, ROP, WOB, cutting element aggressivity, cutting element number and location, formation-engaging element number and location, drill bit diameter, blade geometry, cutting element geometry, formation-engaging element geometry, expected borehole diameter, AKO offset, and AKO angle. The processor may be programmed to calculate an interaction between the input drill bit design and a formation to be drilled to identify the location of the rubbing areas 60.

The identification of one or more rubbing areas 60 may indicate a location where a modification to the drill bit 10 may be desirable. For example, a portion of the drill bit 10 that rubs against the formation 50 may be recessed and/or a formation-engaging element 30 may be added to the drill bit 10 in a location, or at a radial position of the location, identified as rubbing against the one or more rubbing areas 60. If a formation-engaging element 30 is added to the drill bit 10, the formation-engaging element 30 may be configured to at least partially cut the formation 50 at the rubbing areas 60 to break up the formation 50 and preclude rubbing against the bit body 11 of the drill bit 10. Alternatively or additionally, the formation-engaging element 30 may be configured to provide a bearing surface against which the formation 50 rubs, such as to provide a desired depth of cut and/or to reduce wear on the bit body 11.

In one embodiment, an estimate of a borehole diameter may be input by a user, such as an estimated diameter based on a diameter of the drill bit 10, an AKO offset, and an AKO angle. For example, for a drill bit 10 having a diameter of about 8.5 inches, an AKO offset of between about 0.1 inch and about 0.5 inch, and an AKO angle of between about 0.35° and about 1°, an estimated borehole diameter may be between about 9 inches and about 10 inches. A model (e.g., a computer-aided design (CAD) model) of a bottom hole assembly (BHA), such as a BHA including the drill bit 10 and an AKO sub, may be used to calculate the location and orientation of the drill bit 10 relative to the borehole of the estimated diameter. The calculated location and orientation of the drill bit 10 may be used with a detailed model of the drill bit 10 including the cutting elements 20, optionally one or more formation-engaging elements 30, and blades 12. A simulation may be performed of the drill bit 10 drilling into the formation 50. The simulation may be performed at various parameter values, such as at different ROPs, estimated borehole diameters, etc. Locations, shapes, and sizes of the rubbing areas 60 may be determined using the simulation. Adjustments to the design of the drill bit 10 may be made, such as removal of portions of the bit body 11 (e.g., portions of the blades 12) and/or addition of one or more formation-engaging elements 30, as described above.

In another embodiment, a combined model (e.g., a CAD model) of a BHA and of the drill bit 10 may be used simultaneously in a simulation of the drill bit 10 drilling into the formation 50. In such an embodiment, an estimate of the borehole diameter may not be input by a user, since the simulation may calculate the expected borehole diameter. Similar to the method described above, locations, shapes, and sizes of the rubbing areas 60 may be determined using the simulation and adjustments to the design of the drill bit 10 may be made, such as addition of one or more formation-engaging features 30.

Once a desired location of an added formation-engaging element 30 is determined as described above, a cutting element 20 that is positioned at a substantially similar radial position as the formation-engaging element 30 may be identified. An angle α that the formation-engaging element 30 trails the associated cutting element 20 may be determined. With the angle α, a target ROP, and a target rotation speed, a distance that the one or more added formation-engaging elements 30 is to be recessed from a cutting profile of an associated cutting element 20 may be determined using the methods described above with reference to FIGS. 1 and 2.

Optionally, the simulation may be performed again using the adjusted design of the drill bit 10. The drill bit 10 may be formed according to the drill bit design simulated and determined by the methods described above. Thus, one or more formation-engaging elements 30 may be located on the drill bit 10 and may be positioned at a distance from a cutting profile of an associated cutting element 20 as explained above.

Additional non-limiting example embodiments of the present disclosure are set forth below.

Embodiment 1

An earth-boring tool, comprising: a drill bit body having a longitudinal axis; a cutting element positioned on the drill bit body at a radial distance from the longitudinal axis, the cutting element defining a cutting profile when the drill bit body is rotated through one full revolution without advancing the drill bit body along the longitudinal axis, the cutting element exhibiting a first cutting aggressivity; a formation-engaging element exhibiting a second, lower cutting aggressivity than the first cutting aggressivity, the formation-engaging element positioned at the same radial distance from the longitudinal axis as the cutting, wherein the formation-engaging element is recessed from the cutting profile of the cutting element by a distance within about 10% of d, wherein $$d=(\alpha^*x)/(1800^*y),$$

where d is in inches, α is an angle in degrees between the formation-engaging element and the cutting element about the longitudinal axis, x is a target rate of penetration of the drill bit in feet per hour, y is a target rotation speed of the drill bit in revolutions per minute, and the numeral 1800 is in dimensions of (degrees*feet*minutes)/(revolutions*inches*hours).

Embodiment 2

The earth-boring tool of Embodiment 1, wherein the formation-engaging element comprises at least one of a depth of cut control feature and a secondary cutting element.

Embodiment 3

The earth-boring tool of Embodiment 1 or 2, wherein the formation-engaging element is recessed from the cutting profile of the cutting element by a distance within about 5% of d.

Embodiment 4

The earth-boring tool of any one of Embodiments 1 through 3, wherein the formation-engaging element is recessed from the cutting profile of the cutting element by a distance within about 1% of d.

Embodiment 5

The earth-boring tool of any one of Embodiments 1 through 4, wherein the cutting element and the formation-engaging element are located within a cone region of the drill bit.

Embodiment 6

The earth-boring tool of any one of Embodiments 1 through 5, wherein the cutting element and the formation-engaging element are located outside of a cone region of the drill bit.

Embodiment 7

A method of forming an earth-boring tool, the method comprising: selecting a location on an earth-boring tool to position a formation-engaging element; determining a radial distance of the location from a longitudinal axis of the earth-boring tool; identifying a cutting element at a substantially similar radial distance as the location; determining an angle α about the longitudinal axis between the cutting element and the location; positioning a formation-engaging element on the earth-boring tool at the location such that the formation-engaging element is recessed from a cutting profile of the cutting element by a distance within about 10% of d wherein $$d=(\alpha * x)/(1800 * y),$$

where d is in inches, α is in degrees, x is a target rate of penetration of the earth-boring tool in feet per hour, y is a target rotation speed of the earth-boring tool in revolutions per minute, and the numeral 1800 is in dimensions of (degrees*feet*minutes)/(revolutions*inches*hours).

Embodiment 8

The method of Embodiment 7, wherein selecting a location on an earth-boring tool to position a formation-engaging element comprises: using a model of an earth-boring tool to include the formation-engaging element to simulate the earth-boring tool drilling through a formation; identifying a rubbing area where a body of the earth-boring tool rubs against the formation; and selecting the location on the earth-boring tool to position the formation-engaging element at a same radial distance from the longitudinal axis as the rubbing area.

Embodiment 9

The method of Embodiment 8, wherein using a model of an earth-boring tool to include the formation-engaging element to simulate the earth-boring tool drilling through a formation comprises: estimating a borehole diameter to be formed by the earth-boring tool; using a model of a bottom hole assembly including at least an adjustable kick off sub to calculate location and orientation of a drill bit relative to the borehole of the estimated diameter; and using a model of a drill bit including at least blades and the cutting elements to simulate the drill bit drilling through the formation based on the calculated location and orientation of the drill bit relative to the borehole.

Embodiment 10

The method of Embodiment 8, wherein using a model of an earth-boring tool to include the formation-engaging element to simulate the earth-boring tool drilling through a formation comprises using a combined model of a bottom hole assembly and a drill bit to simulate the drill bit drilling through the formation.

Embodiment 11

The method of Embodiment 10, wherein using a combined model of a bottom hole assembly and a drill bit to simulate the drill bit drilling through the formation comprises calculating a borehole diameter formed by the drill bit drilling through the formation using the combined model of the bottom hole assembly and the drill bit.

Embodiment 12

An earth-boring tool, comprising: a drill bit body having a longitudinal axis; at least one cutting element positioned on the drill bit body at a radial distance from the longitudinal axis, the at least one cutting element defining a cutting profile when the drill bit body is rotated through one full revolution without advancing the drill bit body along the longitudinal axis, the at least one cutting element exhibiting a first cutting aggressivity; and at least two formation-engaging elements exhibiting a second, lower cutting aggressivity than the first cutting aggressivity, each of the at least two formation-engaging elements positioned at the same radial distance from the longitudinal axis as a respective cutting element of the at least one cutting element, wherein each of the at least two formation-engaging elements is recessed from the cutting profile of the respective cutting element at a common angle from the cutting profile of the respective cutting element.

The embodiments of the disclosure described above and illustrated in the accompanying drawing figures do not limit the scope of the invention, since these embodiments are merely examples of embodiments of the disclosure. The invention is defined by the appended claims and their legal equivalents. Any equivalent embodiments lie within the scope of this disclosure. Indeed, various modifications of the present disclosure, in addition to those shown and described herein, such as alternative useful combinations of the elements described, will become apparent to those of ordinary skill in the art from the description. Such modifications and embodiments also fall within the scope of the appended claims and their legal equivalents.

What is claimed is:

1. An earth-boring tool, comprising:
   a drill bit body having a longitudinal axis;
   a cutting element positioned on the drill bit body at a radial distance from the longitudinal axis, the cutting element defining a cutting profile when the drill bit body is rotated through one full revolution without advancing the drill bit body along the longitudinal axis, the cutting element exhibiting a first cutting aggressivity; and
   at least two formation-engaging elements positioned on the drill bit body and exhibiting a second, lower cutting aggressivity than the first cutting aggressivity, the at least two formation-engaging elements positioned at the same radial distance from the longitudinal axis as the cutting element,
   wherein each formation-engaging element of the at least two formation-engaging elements is recessed from the cutting profile of the cutting element by a distance within about 10% of d, wherein $$d=(\alpha *x)/(1800*y),$$

where d is in inches, α is an angle in degrees between respective formation-engaging elements of the at least two formation-engaging elements and the cutting element about the longitudinal axis, x is a rate of penetration of the drill bit in feet per hour, y is a rotation speed of the drill bit in revolutions per minute, and the numeral 1800 is in dimensions of (degrees*feet*minutes) divided by (revolutions*inches*hours).

2. The earth-boring tool of claim 1, wherein the at least two formation-engaging elements comprise at least one of a depth of cut control feature and a secondary cutting element.

3. The earth-boring tool of claim 1, wherein each formation-engaging element of the at least two formation-engaging elements is recessed from the cutting profile of the cutting element by a distance within about 5% of d.

4. The earth-boring tool of claim 1, wherein each formation-engaging element of the at least two formation engaging elements is recessed from the cutting profile of the cutting element by a distance within about 1% of d.

5. The earth-boring tool of claim 1, wherein the cutting element and the at least two formation engaging elements are located within a cone region of the drill bit.

6. The earth-boring tool of claim 1, wherein the cutting element and the at least two formation engaging elements are located outside of a cone region of the drill bit.

7. The earth-boring tool of claim 1, wherein the rate of penetration x is between about 100 feet per hour and 150 feet per hour.

8. The earth-boring tool of claim 1, wherein the rotation speed y is between about 40 revolutions per minute and 180 revolutions per minute.

9. The earth-boring tool of claim 1, wherein the cutting element comprises a polycrystalline diamond compact material and the at least two formation-engaging elements comprise a carbide material.

10. A method of forming an earth-boring tool, the method comprising:
creating a model of an earth-boring tool with a computer, comprising:
selecting a location on an earth-boring tool to be formed to position a formation-engaging element;
determining a radial distance of the location from a longitudinal axis of the earth-boring tool to be formed;
identifying a cutting element at a substantially similar radial distance as the location; and
determining an angle α about the longitudinal axis between the cutting element and the location; and
forming the earth-boring tool based on the model, comprising:
positioning a formation-engaging element on the earth-boring tool at the location such that the formation-engaging element is recessed from a cutting profile of the cutting element by a distance within about 10% of d, wherein $$d=(\alpha *x)/(1800*y),$$

where d is in inches, a is in degrees, x is a target rate of penetration of the earth-boring tool in feet per hour, y is a target rotation speed of the earth-boring tool in revolutions per minute, and the numeral 1800 is in dimensions of (degrees*feet*minutes)/(revolutions*inches*hours).

11. The method of claim 10, wherein selecting a location on an earth-boring tool to position a formation-engaging element comprises:
using the model of the earth-boring tool to include the formation-engaging element to simulate the earth-boring tool drilling through a formation;
identifying a rubbing area where a body of the model of the earth-boring tool rubs against the formation; and
selecting the location on the earth-boring tool to be formed to position the formation-engaging element at a same radial distance from the longitudinal axis as the rubbing area.

12. The method of claim 11, wherein using the model of the earth-boring tool to include the formation-engaging element to simulate the earth-boring tool drilling through a formation comprises:
estimating a borehole diameter to be formed by the earth-boring tool;
using a model of a bottom hole assembly including at least an adjustable kick off sub to calculate location and orientation of a drill bit relative to the borehole of the estimated diameter; and
using a model of a drill bit including at least blades and the cutting elements to simulate the drill bit drilling through the formation based on the calculated location and orientation of the drill bit relative to the borehole.

13. The method of claim 12, wherein estimating a borehole diameter to be formed by the earth-boring tool comprises estimating the borehole diameter to be between about 9 inches and about 10 inches.

14. The method of claim 12, wherein using a model of a bottom hole assembly comprises using a computer-aided design (CAD) model of the bottom hole assembly.

15. The method of claim 11, wherein using the model of the earth-boring tool to include the formation-engaging element to simulate the earth-boring tool drilling through a formation comprises using a combined model of a bottom hole assembly and a drill bit to simulate the drill bit drilling through the formation.

16. The method of claim 15, wherein using a combined model of a bottom hole assembly and a drill bit to simulate the drill bit drilling through the formation comprises calculating a borehole diameter formed by the drill bit drilling through the formation using the combined model of the bottom hole assembly and the drill bit.

17. An earth-boring tool, comprising:
a drill bit body having a longitudinal axis;
at least one cutting element positioned on the drill bit body at a radial distance from the longitudinal axis, the at least one cutting element defining a cutting profile when the drill bit body is rotated through one full revolution without advancing the drill bit body along the longitudinal axis, the at least one cutting element exhibiting a first cutting aggressivity; and
at least a first formation-engaging element and a second formation-engaging element positioned on the drill bit body and exhibiting a second, lower cutting aggressivity than the first cutting aggressivity, each of the first and second formation-engaging elements positioned at the same radial distance from the longitudinal axis as a respective cutting element of the at least one cutting element, the first formation-engaging element positioned at a first circumferential position from the at least one cutting element and the second formation-engaging element positioned at a second circumferential position from the at least one cutting element,
wherein each of the first and second formation-engaging elements is recessed from the cutting profile of the respective cutting element on a common line that extends at an angle from the cutting profile of the respective cutting element.

18. The earth-boring tool of claim 17, wherein the at least one cutting element comprises a polycrystalline diamond compact cutting element.

19. The earth-boring tool of claim 17, wherein each of the first and second formation-engaging elements comprises a material selected from the group consisting of a carbide material, a composite material, a diamond material, and a hardfacing material.

20. The earth-boring tool of claim 17, further comprising at least a third formation-engaging element exhibiting the second, lower cutting aggressivity than the first cutting aggressivity, each of the first, second, and third formation-engaging elements positioned at the same radial distance from the longitudinal axis as a respective cutting element of the at least one cutting element and recessed from the cutting profile of the respective cutting element at the common angle.

\* \* \* \* \*

UNITED STATES PATENT AND TRADEMARK OFFICE
CERTIFICATE OF CORRECTION

PATENT NO. : 9,920,575 B2
APPLICATION NO. : 14/263615
DATED : March 20, 2018
INVENTOR(S) : Matthew J. Meiners, Scott E. Donald and Reed W. Spencer It is certified that error appears in the above-identified patent and that said Letters Patent is hereby corrected as shown below:

In the Specification
Column 7, Line 15, change "rotation speedy is" to --rotation speed y is--
Column 7, Line 22, change "rotation speedy of" to --rotation speed y of--
Column 7, Line 30, change "speedy may be" to --speed y may be--

In the Claims
Claim 8, Column 13, Line 32, change "speedy is between" to --speed y is between--

Signed and Sealed this
Twenty-fourth Day of April, 2018

Andrei Iancu
*Director of the United States Patent and Trademark Office*